United States Patent
Feng et al.

(10) Patent No.: US 6,868,517 B1
(45) Date of Patent: Mar. 15, 2005

(54) METHOD AND APPARATUS FOR CHECKING READ ERRORS WITH TWO CYCLIC REDUNDANCY CHECK STAGES

(75) Inventors: Weishi Feng, San Jose, CA (US); Liang Zhang, Union City, CA (US); Zhan Yu, Sunnyvale, CA (US)

(73) Assignee: Marvell International Ltd., Hamilton (BM)

( * ) Notice: Subject to any disclaimer, the term of this patent is extended or adjusted under 35 U.S.C. 154(b) by 533 days.

(21) Appl. No.: 10/118,504

(22) Filed: Apr. 8, 2002

Related U.S. Application Data

(60) Provisional application No. 60/290,683, filed on May 15, 2001.

(51) Int. Cl.[7] .......................... H03M 13/29; H03M 13/23
(52) U.S. Cl. ...................... 714/758; 714/763; 714/765; 714/769; 714/781
(58) Field of Search ................................. 714/758, 763, 714/765, 781; G11C 29/00; H03M 13/23, 13/29

(56) References Cited

U.S. PATENT DOCUMENTS

| | | | |
|---|---|---|---|
| 5,136,592 A | * | 8/1992 | Weng .......................... 714/781 |
| 5,157,669 A | | 10/1992 | Yu et al. |
| 5,602,857 A | * | 2/1997 | Zook et al. .................. 714/765 |
| 5,671,237 A | | 9/1997 | Zook |
| 5,909,334 A | | 6/1999 | Barr et al. |
| 6,092,231 A | * | 7/2000 | Sze ............................. 714/758 |
| 6,317,855 B1 | * | 11/2001 | Horibe ........................ 714/752 |
| 6,594,793 B1 | * | 7/2003 | Guey .......................... 714/758 |

OTHER PUBLICATIONS

Jiin Lee et al.; An advanced Winchester disk controller; VLSI Technology, Systems and Applications, 1989, Proceedings of Technical Papers. 1989 International Symposium on , May 17–19, 1989; P376–379.*

* cited by examiner

*Primary Examiner*—R. Stephen Dildine

(57) ABSTRACT

Method and apparatus for detecting errors in data read from a data storage medium include an error correction step/device which receives at least one of (i) data and (ii) data with errors, from the data storage medium, and outputs an error sequence in a first order in the case where data with errors is received. A first CRC step/device receives the at least one of (i) data and (ii) data with errors from the data storage medium, and outputs a CRC checksum in a second order different from said first order. A second CRC step/device receives both the error sequence and the CRC checksum, and outputs another CRC checksum indicative of whether the correction device or step has generated a correct error sequence. Preferably, a first CRC is coupled parallel to a Reed-Soloman decoder, and a second CRC is coupled in series with the first CRC and so as to receive the output of the R-S decoder. The second CRC will thus be able to detect errors in the output of the R-S decoder, and provide an error signal which will cause the erroneous data to be reread.

80 Claims, 2 Drawing Sheets

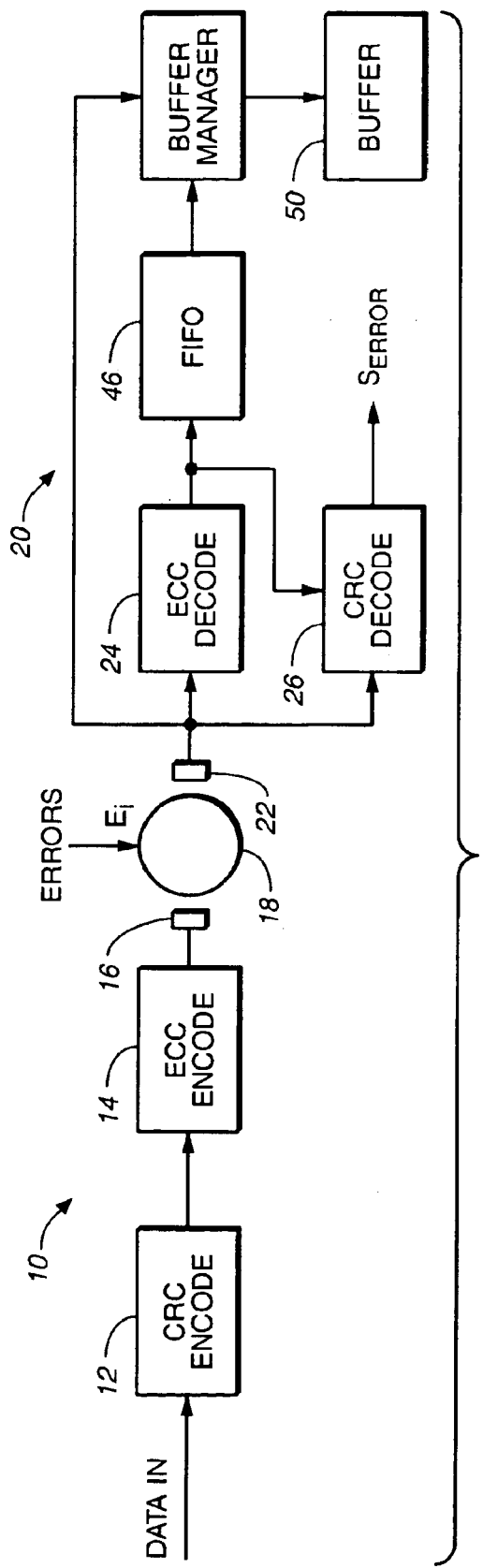
FIG._1 (PRIOR ART)
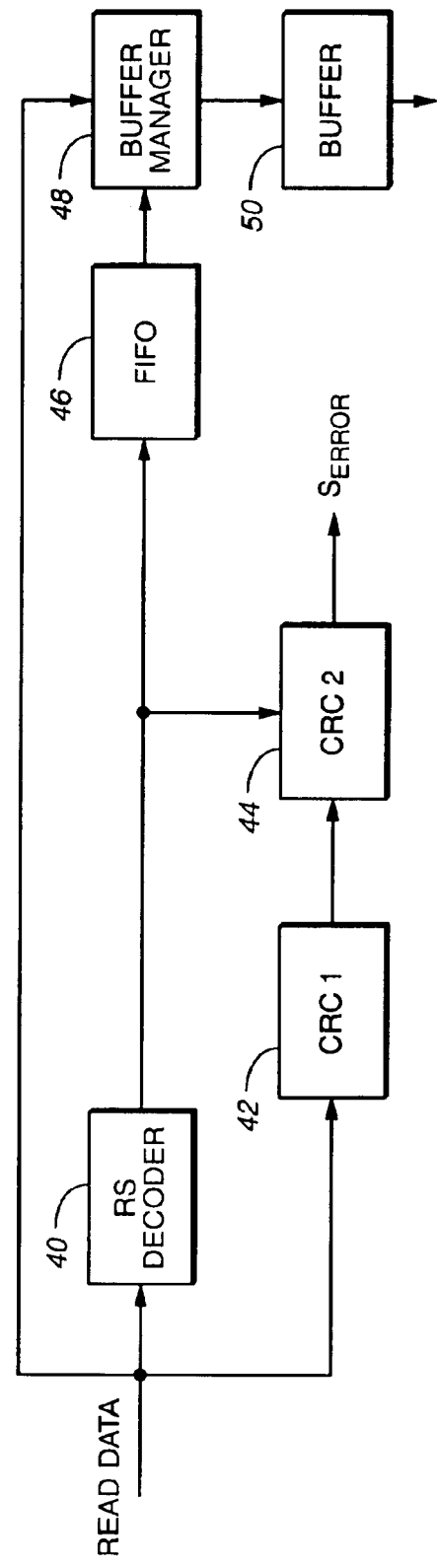
FIG._2

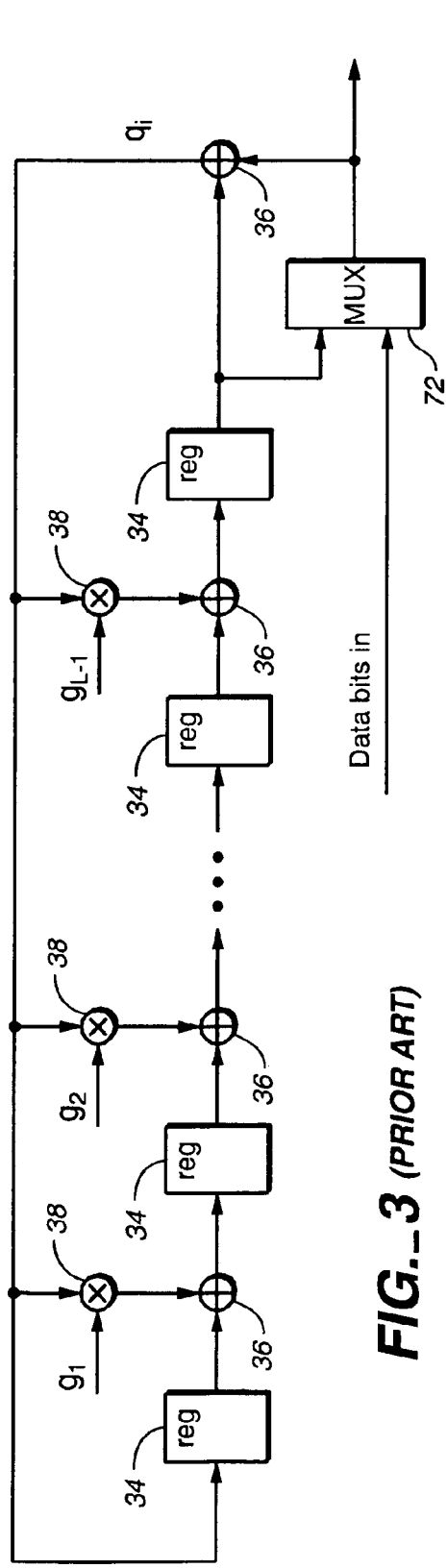
FIG._3 *(PRIOR ART)*
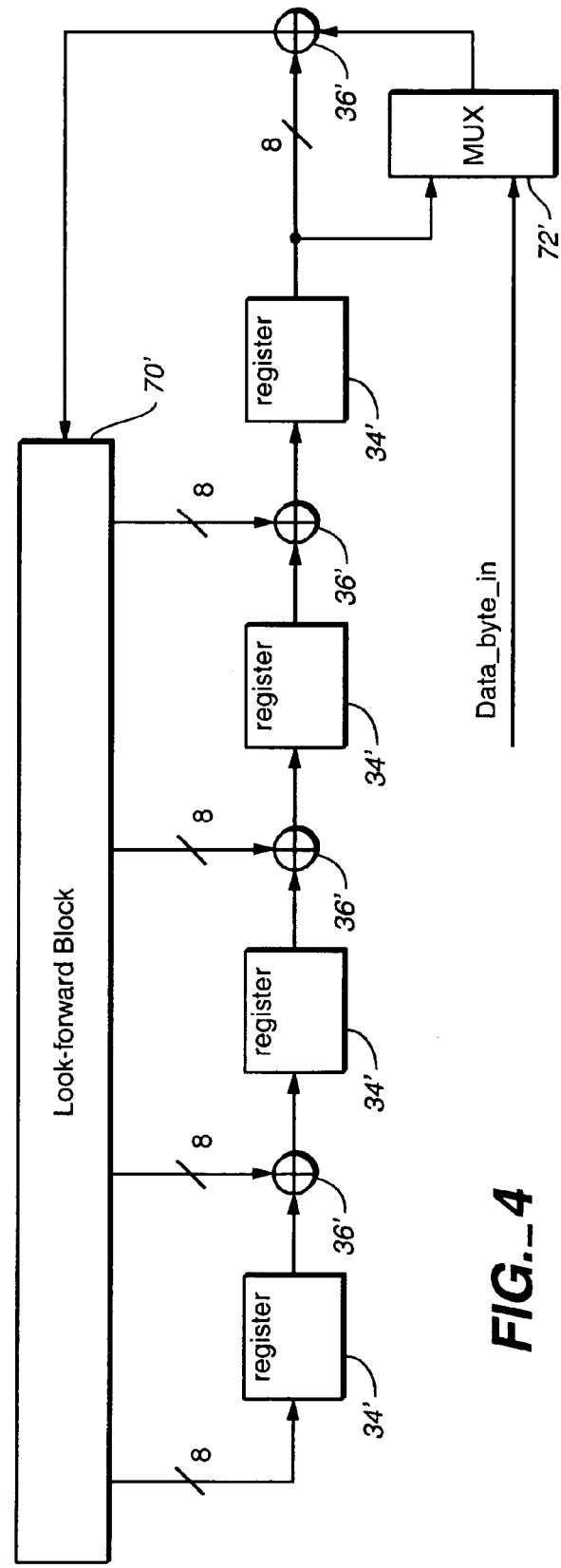
FIG._4

METHOD AND APPARATUS FOR CHECKING READ ERRORS WITH TWO CYCLIC REDUNDANCY CHECK STAGES

The subject application claims priority to Application No. 60/290,683, filed May 15, 2001, incorporated herein by reference.

BACKGROUND OF THE INVENTION

1. Field of the Invention

The present invention relates to method and apparatus for checking read errors using two CRC (Cyclic Redundancy Check) stages, and preferably to method and apparatus for detecting errors read from a magnetic disk storage medium in the read channel of a hard disk drive. The present invention also relates to method and apparatus for detecting and correcting such errors.

2. Related Art

In a data storage system (such as a computer hard disk drive), it is very important that the data read from the data storage system is accurate. One solution is to use an error-correcting code (ECC, such as Reed-Solomon code, etc.) to correct the errors in the data read out from the storage device. However, if the number of errors in the read out data is greater than the designed ECC correction power, there is a small probability that the ECC unit may add errors to the data; this is called miscorrection. A second error detection code, usually a cyclic redundancy check (CRC) code, may be used to detect such miscorrection. Each of U.S. Pat. Nos. 5,157,669; 5,671,237, and 5,909,334 describes circuitry and processes for detecting and correcting errors in digital data read from disk storage media. The contents of these three U.S. patents is incorporated herein by reference.

A disk drive data sector typically has 512 bytes of data, denoted $B_0, B_1, \ldots, B_{511}$. CRC bytes are calculated using all 512 bytes of data. In the following description, 4 CRC bytes will be used for simplicity. However, the techniques described can be easily used with other numbers of CRC bits/bytes, as needed. The techniques described below can be easily modified for other numbers of CRC bytes or other sector sizes.

Let $C_0, C_1, C_2, C_3$ be the 4 CRC bytes. Each byte includes 8 bits. Bits $b_{1,0}, \ldots, b_{i,7}$ denote the 8 bits of the byte $B_i$, and a similar notation is used for other bytes. Let:

$$g(x) = \sum_{i=0}^{32} g_i x^i \quad (1)$$

be the generator polynomial of the CRC code, where $g_i$ is either 0 or 1.

Now, let $N_I$ be the number of interleaves and $U_i$ be XOR sum of data bytes across the interleaves, that is:

$$U_i = B_{N_I \times i} + B_{N_I \times i+1} \cdots + B_{N_I \times i+N_I-1}, \text{ and } B_i=0 \text{ if } i \geq s \quad (2)$$

where the "+" is a bitwise XOR operation, and s is the number of data bytes per sector. If other data (e.g., SPBA) needs to be protected by ECC and CRC, these data are treated as user data. (Example, $U_0=B_0+B_1+B_2$ in three interleave case, and $U_0=B_0+B_1+B_2+B_3$ in four interleave case).

Let k be the least integer that greater than or equal to the number of data bytes divide by the number of interleaves, that is, $$k=\lceil s \div N_I \rceil. \quad (3)$$

The CRC encoder calculates the remainder r(x) of the following polynomial:

$$x^L \times \left( \sum_{i=0}^{k-1} \sum_{j=0}^{7} u_{(k-1-i),j} \cdot x^{8i+j} \right) \quad (4)$$

divided by the generator polynomial of the CRC code, where L is the number of CRC bits. The 32 coefficients of r(x) form the 4 CRC bytes: $C_0=(r_{24}, \ldots, r_{31})$, $C_1=(r_{16}, \ldots, r_{23})$, $C_2=(r_8, \ldots, r_{15})$, $C_3=(r_0, \ldots, r_7)$. Note that the bits order of the four CRC bytes does not matter as long as the CRC encoding and CRC checking units agree on the CRC bits order.

In three interleave case, all data are arranged as follows:
First interleave $B_0\ B_3 \ldots B_{507}\ B_{510}\ C_1\ D_{0,0}\ D_{0,1} \ldots D_{0,2t-1}$
Second interleave $B_1\ B_4 \ldots B_{508}\ B_{511}\ C_2\ D_{1,0}\ D_{1,1} \ldots D_{1,2t-1}$
Third interleave $B_2\ B_5 \ldots B_{509}\ C_0\ C_3\ D_{2,0}\ D_{2,1} \ldots D_{2,2t-1}$
where $D_{i,0}, \ldots, D_{i,\ 2t-1}$ are the ECC bytes for the ith interleave generated by a Reed-Solomon encoder, and 2t is the number of ECC bytes per interleave.

In the four interleave case, the data arrangement would look like:
First interleave $B_0\ B_4 \ldots B_{508}\ C_0\ D_{0,0}\ D_{0,1} \ldots D_{0,2t-1}$
Second interleave $B_1\ B_5 \ldots B_{509}\ C_1\ D_{1,0}\ D_{1,1} \ldots D_{1,2t-1}$
Third interleave $B_2\ B_6 \ldots B_{510}\ C_2\ D_{2,0}\ D_{2,1} \ldots D_{2,2t-1}$
Fourth interleave $B_3\ B_7 \ldots B_{511}\ C_3\ D_{3,0}\ D_{3,1} \ldots D_{3,2t-1}$ The three interleave case will be described in the following. All the data are written on the disk in the following "normal" order:
$B_0, B_1, \ldots, B_{511}, C_0, \ldots, C_3, D_{0,0}, D_{1,0}, D_{2,0}, \ldots D_{0,2t-1}, D_{1,2t-1}, D_{2,2t-1}$, In FIG. 1, data to be written on a disk is supplied to a CRC encoder 12, then to an ECC encoder 14, for writing onto disk 18 with head 16. When data is read back from the disk 18 with head 22, the data is often corrupted with errors. After the data is stored in the buffer memory 50, the ECC unit 24 computes the error values and the error locations. The buffer manager 48 (BM) takes the error values and error locations, and corrects the errors in the memory 50. Because the CRC unit 26 does not have access to the data after ECC correction by the ECC unit 24, the CRC unit 26 does the CRC check using the error vector and the data before ECC correction.

Another problem is that, the ECC unit 24 generates the error vector in a different order. Instead of generating the error vector in the normal order shown below:
$EB_0, EB_1, \ldots, EB_{511}, EC_0, EC_1, EC_2, EC_3, ED_{0,0}, \ldots, ED_{2,2t-1}$,
the ECC unit 24 generates the errors in a "reversed interleaved order", shown below:
$ED_{0,2t-1}, ED_{0,2t-2}, \ldots, ED_{0,0}, EC_1, EB_{510}, EB_{507}, \ldots, EB_0$ then
$ED_{1,2t-1}, ED_{1,2t-2}, \ldots, ED_{1,0}, EC_2, EB_{511}, EB_{508}, \ldots, EB_1$ and then
$ED_{2,2t-1}, ED_{2,2t-2}, \ldots, ED_{2,0}, EC_2, EB_{509}, EB_{506}, \ldots, EB_2$
where the notation $EB_0$ means the error value at the position of $B_0$, that is, data read back is actually $RB_0=(B_0+EB_0)$. Note that most entries in the error sequence are zeros.

Thus, what is needed is a error detection technique which reliably and accurately detects errors in read digital data.

SUMMARY OF THE INVENTION

The present invention provides apparatus and method which uses two CRC stages to detect and/or correct errors in read digital data.

According to a first aspect of the present invention, structure and/or steps are provided for detecting errors in data stored in a data storage medium, including a correction, device or step which receives at least one of (i) data and (ii) data with errors, from the data storage medium, and outputs an error sequence in a first order in the case where data with errors is received. A first CRC device or step is provided which receives at least one of (i) data and (ii) data with errors from the data storage medium, and outputs a CRC checksum. A second CRC device or step then receives both the error sequence and the CRC checksum, and outputs another CRC checksum indicative of whether the correction device or step has generated a correct error sequence.

According to a second aspect of the present invention, structure and/or function for determining whether digital data read from a digital data storage device contains errors, includes decoder structure that receives the digital data read from the storage device, the data comprising data bytes and bytes with errors interleaved in a first order, said decoder structure outputting an error sequence in a reversed interleaved order. A first CRC circuit receives the digital data read from the storage device in the first interleaved order, and outputs a remainder. A second CRC circuit receives both the error sequence in reverse interleaved order (generated by the correction device) and the remainder, performs a mathematical operation on the first error sequence and the remainder, and outputs an error signal when the mathematical operation determines that the correction device did not generate the error sequence correctly.

According to yet another aspect of the present invention, a read channel for a disk storage medium reads digital data comprising data bytes and bytes with errors, and includes a head for reading the digital data from the disk storage medium. An error correction device is provided which receives the data bytes and the bytes with errors from the disk storage medium, performs an error correction operation on the received bytes and bytes with errors, and outputs a first error sequence in a first order. A first CRC device receives the data bytes and the bytes with errors from the disk storage medium, performs a cyclic redundancy check operation on the received bytes, and outputs a CRC checksum. A second CRC device receives both the error sequence and the CRC checksum, performs a cyclic redundancy check operation on the received error sequence and CRC checksum, and outputs a signal indicative of the presence or absence of an error in the error sequence.

In a further aspect of the present invention, read channel apparatus for determining whether digital data read from a digital data storage device is to be error-corrected or re-read includes an error correction decoder that receives the digital data read from the storage device, the data comprising data bytes and bytes with errors interleaved in a first order, said decoder outputting an error sequence in a reversed interleaved order. A first CRC circuit is provided that receives the digital data read from the storage device in the first interleaved order, and outputs a remainder. A second CRC circuit receives both the error sequence in reversed interleaved order (generated by the correction device) and the remainder, performs a mathematical operation on the error sequence and the remainder, and outputs an error signal when the mathematical operation determines that an error exists in the error sequence. Error correction circuitry may also be provided for error-correcting the received data bytes when said second CRC circuit does not output the error signal. Additionally, control circuitry may also be supplied for causing the digital data to be re-read from the digital data storage device when said second CRC circuit outputs the error signal.

BRIEF DESCRIPTION OF THE DRAWINGS

The present invention will be more easily understood from the following detailed description of the presently preferred embodiment when taken in conjunction with the attached Drawings which show:

FIG. 1 is a schematic block diagram of known circuitry for reading digital data from a disk medium; and FIG. 2 is a schematic block diagram of circuitry for reading digital data from a disk medium according the present invention.

FIG. 3 is a schematic block diagram of prior art circuitry for binary polynomial division.

FIG. 4 is a schematic block diagram of a binary division circuit which operates at a byte clock rate with look-forward structure, according the preferred embodiment.

DETAILED DESCRIPTION OF THE PRESENTLY PREFERRED EMBODIMENTS

While the present invention will be described with respect to the read channel of a magnetic disk drive, it is to be understood that the invention has applicability in other storage media such as magnetic tape, optical, magneto-optical, integrated circuits, etc. The present invention may also find use in other technical fields such as digital transmission error detection in communications systems such as telephony, satellite, Internet, LANs, etc. Also, the present invention will be described in terms of integrated circuitry residing on a single chip in the read channel of a computer hard disk drive. However, the present invention may be embodied in software, as a series of processing steps, or as a combination of hardware and software, as will be understood by those of ordinary skill in the art.

The present invention provides a second CRC decoding stage, which receives outputs from both the ECC decoder and the first CRC stage, to determine whether the error sequence generated in the ECC decoder is correct or not. Referring to FIG. 2, the digital data read from the disk is stored in the buffer memory 50 and decoded by Reed-Soloman (R-S) decoder 40. The error locations and the error values generated by the R-S decoder 40 are passed to FIFO 46. The buffer manager 48 takes the error locations and error values, and corrects the errors contained in buffer memory 50, as shown. The read data is also provided to a first CRC 42 where the remainder $R_g$ is calculated. When $R_g$ is zero and the syndromes calculated by the R-S decoder 40 are also zero, there is no error in the read data; where $R_g$ is nonzero, an error exists in the read data. The output of CRC 42 is supplied to a second CRC 44, as shown. The second CRC 44 receives error locations and error values in an order which is the reverse of the order received by the CRC 42. The CRC 44 thus calculates $R_{\hat{g}hat}[c_{\hat{h}at}(x)]$, where $g_{\hat{h}at}$ and $c_{\hat{h}at}$ represent the reversed generator polynomial $X^L g(x^{-1})$ and the modified reversed error sequence in bits, respectively. When $R_{\hat{g}hat}$ is zero, the R-S decoder 40 generated the error locations and error values correctly; where $R_{\hat{g}hat}$ is nonzero, the R-S decoder 40 failed to generate the error sequence correctly.

The present invention utilizes several additional techniques for accurately detecting errors in read data. First, the CRC-1 42 and the CRC-2 44 according to the present invention preferably use a binary code for the error detection rather than using a second Reed-Solomon code. (Both the: CRC-1 42 and the CRC-2 44 use the same structure as shown in FIG. 4; the difference is in the coefficients of the generated polynomial.) The use of binary code allows for more flexibility in sector length. For example, the disk drive industry is now discussing 4 KB sector size, which would require significant changes to support such long sectors. The binary CRC detector according to the present invention can support sector length roughly up to 64 MB.

Second, the "miscorrection detection" according to the preferred embodiment is based on (i) the raw data before ECC correction, and (ii) the error vector (error locations and error values). The CRC-1 and the R-S decoder use the raw data, and the R-S decoder provides the error vector. This is in contrast to the use of error location and evaluation polynomials.

Third, while binary-CRC code typically operates at bit clock, the preferred embodiment uses a look-forward technique for the binary CRC polynomial division circuits so that the binary polynomial division circuit operates at byte clock (or other clock rates depending on how many bits are being "looked forward"). Both the CRC-1 and the CRC-2 in FIG. 2 preferably operate at a byte clock rate.

Now, the method of error detection with reversed bit sequence will be described. Suppose $$d(x) = \sum_{i=0}^{n-1} d_i x^i \qquad (5)$$

represents the data sequence in bits, and $$d(x)=a(x)g(x)+r(x) \qquad (6)$$

Suppose r(x) (calculated by CRC-1, 42) is known, and the data sequence is in reverse order, i.e:

$$x^{n-1}d(x^{-1}) = \sum_{i=0}^{n-1} d_{n-1-i} x^i. \qquad (7)$$

It should be determined whether this "reversed bit sequence" is actually the reversed sequence (i.e., whether the ECC unit 40 generated the error sequence correctly, in reversed order). Note that $$x^{n-1}d(x^{-1})=x^{n-1}[a(x^{-1})g(x^{-1})]+x^{n-1}r(x^{-1})=[x^{n-L-1}a(x^{-1})][x^L g(x^{-1})]+ x^{n-1}r(x^{-1}) \qquad (8)$$

and therefore $$x^{n-1}d(x^{-1})-x^{n-1}r(x^{-1})=[x^{n-L-1}a(x^{-1})][x^L g(x^{-1})]. \qquad (9)$$

Thus, the "reversed sequence" is simply modified with the remainder calculated by CRC-1, (42 in FIG. 2), and a remainder of modified sequence is calculated by dividing by the "reversed generator polynomial" defined as follows:

$$\hat{g}(x)=x^L g(x-1), \qquad (10)$$

This remainder should be zero as shown above if the "reversed sequence" is indeed the reversed sequence.

Given the data sequence read back:
$RB_0$, $RB_1$, . . . , $RB_{511}$, $RC_0$, . . . , $RC_3$, $RD_{0,0}$, $RD_{1,0}$, $RD_{2,0}$, . . . , $RD_{0,2t-1}$, $RD_{1,2t-1}$, $RD_{2,2t-1}$ and the error sequences generated by the ECC unit 40:
$ED_{0,2t-1}$, $ED_{0,2t-2}$, . . . , $ED_{0,0}$, $EC_1$, $EB_{510}$, $EB_{507}$, . . . , $EB_0$
$ED_{1,2t-1}$, $ED_{1,2t-2}$, . . . , $ED_{1,0}$, $EC_2$, $EB_{511}$, $EB_{508}$, . . . , $EB_1$
$ED_{2,2t-1}$, $ED_{2,2t-2}$, . . . , $ED_{2,0}$, $EC_3$, $EC_0$, $EB_{509}$, $EB_{506}$, . . . , $EB_2$ Notation: Let $\underline{B_i}=(b_{i,7},b_{i,6},b_{i,5},b_{i,4},b_{i,3},b_2,b_{i,1},b_{i,0})$ be the "bits order reversed" byte of $B_i$.

Given the above, the "Miscorrection detection" algorithm is described as follows:

Step 1: CRC-1, 42 calculates the reminder RM0, RM1, RM2, RM3 of the sequence: $RB_0+RB_1+RB_2$, $RB_3+RB_4+RB_5$, $RB_6+RB_7+RB_8$, . . . , $RB_{510}+RB_{511}$, $RC_0$, $RC_1$, $RC_2$, $RC_3$, with respect to the generator polynomial g(x).

Step2: CRC-2 calculates the remainder of the following sequence: 0, 0, ($\underline{RM_1}+\underline{EC_1}$), 0, $\underline{EB_{510}}$, $\underline{EB_{508}}$, . . . , $\underline{EB_1}$, with respect to the "reversed generator polynomial" $\hat{g}(x)$.

Step3: CRC-2 calculates the remainder of the following sequence: 0, ($\underline{EC_2}+\underline{RM_2}$), 0, 0, $\underline{EB_{511}}$, $\underline{EB_{508}}$, . . . , $\underline{EB_1}$, with respect "reversed generator polynomial" $\hat{g}(x)$. And add this remainder with the remainder calculated in the Step 2.

Step 4: CRC-2 calculates the remainder of the following sequence: ($\underline{RM3}+\underline{EC_3}$), 0, 0, ($\underline{RM_0}+\underline{EC3}$), $\underline{EB_{509}}$, $\underline{EB_{506}}$, . . . , $\underline{EB_2}$, with respect to the "reversed generator polynomial" $\hat{g}(x)$; and adds this remainder with the remainder calculated in the Step 2.

If the summation (i.e.: bitvise XOR) of the three remainders calculated in Steps 2, 3, 4 is not all-zero, a "miscorrection" is detected by CRC-2.

The circuitry for implementing the above algorithm (FIG. 2) includes two binary polynomial division circuits (FIG. 4) which operate at symbol clock rates with a look-forward technique which will be described next. The symbol clock rate could be a byte clock rate or another clock rate depending on the symbol size. A "symbol" is a group of bits, such as a byte (if it is a group of 8 bits); or a 10-bit symbol if it is a group of 10 bits.

Note that a variation of the above algorithm is also clear:

Step 1: CRC-1, 42 calculates the reminder RM0, RM1, RM2, RM3 of the sequence: $RB_0+RB_1+RB_2$, $RB^3+RB^4+RB^5$, $RB^6+RB^7+RB^8$, . . . , $RB^{510}+RB^{511}$, $RC_0$, $RC_1$, $RC_2$, $RC_3$, 0, 0, 0, 0, with respect to the generator polynomial g(x).

Step2: Calculates the reminder of the following sequence: $\underline{RM_3}$, $\underline{RM_2}$, $\underline{RM_1}$, $\underline{RM_0}$, 0, 0, $\underline{EC_1}$, 0, $\underline{EB_{510}}$, $\underline{EB_{507}}$, . . . , $\underline{EB_0}$, with respect to the "reversed generator polynomial" $\hat{g}(x)$.

Step3: Calculates the reminder of the following sequence: 0, $\underline{EC_2}$, 0, 0, $\underline{EB_{511}}$, $\underline{EB_{508}}$, . . . , $\underline{EB_1}$, with respect to the "reversed generator polynomial" $\hat{g}(x)$. And add this reminder with the reminder calculated in the Step 2.

Step 4: Calculates the reminder of the following sequence: $\underline{EC_3}$, 0, 0, $\underline{EC_0}$, $\underline{EB_{509}}$, $\underline{EB_{506}}$, . . . , $\underline{EB_2}$, with respect to the "reversed generator polynomial" $\hat{g}(x)$. And add this reminder with the reminder calculated in the Step 2.

If the summation (i.e.: bitwise XOR) of the three reminders calculated in Steps 2, 3, 4 is not all zero, a "miscorrection" is detected.

Let $$v(x) = \sum_{i=0}^{k-1} v_i x^i \qquad (11)$$

represent k bits of data, then the circuit depicted in FIG. 3 calculates the remainder of:

$$x^L v(x) \text{ divided by } g(x) = \sum_{i=0}^{L} g_i x^i \text{ (Note: } g_0 = g_L = 1). \quad (12)$$

FIG. 3 shows a known polynomial division circuit while FIG. 4 shows the binary polynomial division circuit which operates at a byte clock rate with a look-forward structure, according to the present invention. In FIG. 3, after k bits of data is shifted into Mux 32 at a bit-clock rate, the calculation of the remainder is done and the remainder is stored in the registers 34 and is ready to be shifted out at the bit-clock rate. However, by investigating the polynomial division, it is discovered that, if at time i the content in the registers 34 are $r_0, r_1, r_2, \ldots, r_{L-1}$, then at time (i+8) (look-forward by an 8 bit-clock so that the circuit can operate at a byte clock rate) (of course, if the circuit of FIG. 4 according to the present invention operates at a 10-bit symbol clock rate, then the look-forward can be at 10 bit-clock cycles), then the content of the registers 34 are the summation (implemented as, bit-wise XORs) of the content of the registers and the following lines, each line is multiplied (implemented as AND circuits) by the feed-back bit q; therefore if the corresponding feed-back bit q is zero, that line is all zeros):

|  |  |  |  |  |  |  |  | $g_7$ | $g_8$ | ... | $g_{L-8} \times q_i$ |
|--|--|--|--|--|--|--|--|--|--|--|--|
|  |  |  |  |  |  |  | $g_6$ | $g_7$ | $g_8$ | ... | $g_{L-7} \times q_{i+1}$ |
|  |  |  |  |  |  | $g_5$ | $g_6$ | $g_7$ | $g_8$ | ... | $g_{L-6} \times q_{i+2}$ |
|  |  |  |  |  | $g_4$ | $g_5$ | $g_6$ | $g_7$ | $g_8$ | ... | $g_{L-5} \times q_{i+3}$ |
|  |  |  |  | $g_3$ | $g_4$ | $g_5$ | $g_6$ | $g_7$ | $g_8$ | ... | $g_{L-4} \times q_{i+4}$ |
|  |  |  | $g_2$ | $g_3$ | $g_4$ | $g_5$ | $g_6$ | $g_7$ | $g_8$ | ... | $g_{L-3} \times q_{i+5}$ |
|  |  | $g_1$ | $g_2$ | $g_3$ | $g_4$ | $g_5$ | $g_6$ | $g_7$ | $g_8$ | ... | $g_{L-2} \times q_{i+6}$ |
|  | $g_0$ | $g_1$ | $g_2$ | $g_3$ | $g_4$ | $g_5$ | $g_6$ | $g_7$ | $g_8$ | ... | $g_{L-1} \times q_{i+7}$ |

The binary polynomial division circuit of FIG. 4 operates at a byte clock rate (as an example, note that this technique can be easily extended to other bit-widths, like a 10-bit symbol clock rate). The look-forward logic in FIG. 4 contains logic 34', 36', and 72' to calculate the feed-back bits $q_i$, using the AND and XOR operation described above, i.e., the calculation of the feed-back bits is straightforward. The look-forward block 70' calculates precisely what is shown in the above table. Given this architecture, note that only two such blocks are used, one for the generator polynomial and one for the "reverse generator" polynomial, i.e., one FIG. 4 circuit would be included in each of the CRC-1 and CRC-2. To reduce the complexity of this circuit, one may also search the following polynomial for 40-bit CRC operates at 10-bit symbol clock:

$$g(x) = 1 + x^{11} + x^{25} + x^{28} + x^{29} + x^{40} \quad (13)$$

Note that this polynomial has the following advantages:
1. Since $g_1 = \ldots = g_{10} = g_{30} = \ldots = g_{39} = 0$, the "look-forward" of the feed-back bits for both the generator polynomial and the "reverse generator polynomial" are extremely simple: they are simply the last 10 bits in the registers XOR with the current 10-bits of data.
2. Most coefficients are zeros, so the XOR of the lines in Table 1 is simple.

When CRC 44 of FIG. 2 detects an error in the decoded data, it may generate an error signal $S_e$ which may cause the data block to be reread in an attempt to correct the error. In the embodiment where CRC receives the output of CRC 42, it can use logic to determine whether to output the error signal $S_e$. For example, CRC 44' may output $S_e$ when both $R_g$ and $R_{ghat}$ are nonzero, or when any (or a predetermined) one of them is nonzero. In a particularly preferred embodiment, CRC 44 takes 4 bytes from CRC 42, adds 4 bytes to the R-S 40 decoder output, and calculates a remainder R. If R is zero, there is no error; if R is nonzero, an error may exist, and $S_e$ is output. In this way, errors can be more accurately detected, since a CRC operation is performed on both the read data and the error vector generated by the R-S decoder (which generates the error sequence in the reverse interleaved order). With this technique, data errors may be detected approximately $10^9$ more reliably, which is especially useful in high reliability applications.

Thus, what has been described is apparatus an method and apparatus for accurately detecting errors in received digital data.

The individual components shown in outline or designated by blocks in the attached Drawings are all well-known in the error detection arts, and their specific construction and operation are not critical to the operation or best mode for carrying out the invention.

While the present invention has been described with respect to what is presently considered to be the preferred embodiments, it is to be understood that the invention is not limited to the disclosed embodiments. To the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. Apparatus for detecting errors in data stored in a data storage medium, comprising:
    a correction device which receives at least one of (i) data and (ii) data with errors, from the data storage medium, and outputs an error sequence in a first order in the case where data with errors is received;
    a first CRC device which receives at least one of (i) data and (ii) data with errors from the data storage medium, and outputs a CRC checksum in a second order different from said first order; and
    a second CRC device which receives both the error sequence and the CRC checksum, and outputs another CRC checksum indicative of whether the correction device or step has generated a correct error sequence.

2. Apparatus according to claim 1, wherein said second CRC device combines a predetermined number of bytes from the error sequence with a predetermined number of bytes from the CRC checksum, and determines that there is no error in the error sequence when a remainder of said combination is substantially zero.

3. Apparatus according to claim 2, wherein said second CRC device determines that there is an error in the error sequence when said remainder of said combination is not substantially zero, and outputs a correction failure signal in response to the determined error.

4. Apparatus according to claim 3, further comprising control circuitry which receives the correction failure signal, and outputs a re-read signal to cause said data to be read again from the data storage medium.

5. Apparatus according to claim 1, wherein said correction device receives the data and errors from the storage medium in a first interleaved order, and outputs the error sequence in a reversed interleaved order which is a reverse of said first interleaved order.

6. Apparatus according to claim 5, wherein said second CRC device determines the presence or absence of the error in the first error sequence based on a cyclic redundancy check of the first interleaved order and the reversed interleaved order.

7. Apparatus for determining whether digital data read from a digital data storage device contains errors, comprising:
- a decoder that receives the digital data read from the storage device, the data comprising data bytes and error bytes interleaved in a first order, said decoder outputting a first error sequence in a reversed interleaved order;
- a first CRC circuit that receives the digital data read from the storage device in the first interleaved order, and outputs a CRC checksum in an interleaved order that is different from the reversed interleaved order; and
- a second CRC circuit that receives both the error sequence and the CRC checksum, performs a mathematical operation on the error sequence and the CRC checksum, and outputs an error signal when the mathematical operation determines that an error exists in the first error sequence.

8. Apparatus according to claim 7, wherein said second CRC circuit determines that there is no error in the first error sequence when a remainder of said mathematical operation is substantially zero.

9. Apparatus according to claim 8, further comprising:
- a memory for receiving the digital data read from the storage device in the first interleaved order;
- a FIFO circuit coupled to said decoder, for storing the error sequence; and
- a memory manager, coupled to said FIFO and to said memory, for correcting the digital data stored in said memory based on the error sequence stored in said FIFO.

10. Apparatus according to claim 9, wherein said memory manager corrects the stored digital data in response to said second CRC device determining that there is no error in the first error sequence.

11. Apparatus according to claim 10, further comprising control circuitry that causes the digital data to be read again from the storage device when said second CRC circuit outputs the error signal.

12. Apparatus according to claim 7, further comprising a reading device which reads the digital data from the storage device.

13. Apparatus according to claim 7, wherein said decoder comprises a Reed-Soloman decoder.

14. Apparatus for detecting errors in data stored in a data storage medium, comprising:
- first means for receiving at least one of (i) data and (ii) data with errors from the data storage medium, and outputting an error sequence in a first order in the case where data with errors is received;
- second means for receiving the at least one of (i) data and (ii) data with errors from the data storage medium, and outputting a remainder in a second order different from the first order; and
- third means for receiving both the error sequence and the remainder, and outputting a signal indicative of the presence or absence of an error in the error sequence.

15. Apparatus according to claim 14, wherein said third means combines a predetermined number of bytes from the error sequence with a predetermined number of bytes from the remainder, and determines that there is no error in the error sequence when a remainder of the combination is substantially zero.

16. Apparatus according to claim 15, wherein said third means determines that there is an error in the error sequence when said remainder of the combination is not substantially zero, and outputs a correction failure signal in response to the determined error.

17. Apparatus according to claim 16, further comprising fourth means for receiving the correction failure signal, and outputting a re-read signal to cause said data to be read again from the data storage medium.

18. Apparatus according to claim 14, wherein said first means receives the data and errors from the storage medium in a first interleaved order, and outputs the error sequence in a reversed interleaved order which is a reverse of said first interleaved order.

19. Apparatus according to claim 18, wherein said third means determines the presence or absence of the error in the error sequence based on a cyclic redundancy check of the first interleaved order and the reversed interleaved order.

20. Apparatus for determining whether digital data read from a digital data storage device contains errors, comprising:
- first means for receiving the digital data read from the storage device, the data comprising (i) data bytes and (ii) bytes with errors, interleaved in a first order, said first means outputting an error sequence in a reversed interleaved order;
- second means for receiving the digital data read from the storage device in the first interleaved order, and for outputting checksum data in an interleaved: order that is different from the reversed interleaved order; and
- third means for receiving both the error sequence and the checksum data, performing a mathematical combination operation on said error sequence and the checksum data, and outputting an error signal when the combination determines that an error exists in the error sequence.

21. Apparatus according to claim 20, wherein said third means determines that there is no error in the error sequence when a remainder of said mathematical combination operation is substantially zero.

22. Apparatus according to claim 21, further comprising:
- fourth means for receiving the digital data read from the storage device in the first interleaved order;
- fifth means, coupled to said first means, for storing the error sequence; and
- sixth means, coupled to said fourth means and to said fifth means, for correcting the digital data stored in said fourth means based on the error sequence stored in said fifth means.

23. Apparatus according to claim 22, wherein said sixth means corrects the stored digital data in response to said third means determining that there is no error in the error sequence.

24. Apparatus according to claim 22, further comprising seventh means for causing the digital data to be read again from the storage device when said third means outputs the error signal.

25. Apparatus according to claim 22, further comprising reading means for reading the digital data from the storage device.

26. Apparatus according to claim 22, wherein said first means comprises a Reed-Soloman decoder.

27. Apparatus according to claim 22, wherein said second means comprises a first CRC circuit, and wherein said third means comprises a second CRC circuit.

28. Apparatus according to claim 22, wherein said fourth means comprises a buffer memory, wherein said fifth means comprises a FIFO, and wherein said sixth means comprises a buffer manager.

29. A read channel for a disk storage medium which reads digital data comprising data bytes and bytes with errors, said read channel comprising:
- a head for reading the digital data from the disk storage medium;
- an error correction device which receives the data bytes and the bytes with errors from the head, performs an error correction operation on the received bytes, and outputs an error sequence in a first order;
- a first CRC device which receives the data bytes and the bytes with errors from the head, performs a cyclic redundancy check operation on the received bytes, and outputs a CRC checksum in a second order; and
- a second CRC device which receives both the error sequence and the CRC checksum, performs a cyclic redundancy check operation on error sequence and the CRC checksum, and outputs a signal indicative of the presence or absence of an error in the error sequence.

30. A read channel according to claim 29, wherein said second CRC device combines a predetermined number of bytes from the error sequence with a predetermined number of bytes from the CRC checksum, and determines that there is no error in the error sequence when a remainder of the combination is substantially zero.

31. A read channel according to claim 30, wherein said second CRC device determines that there is an error in the error sequence when said remainder of said combination is not substantially zero, and outputs an error correction failure signal in response to the determined error.

32. A read channel according to claim 31, further comprising control circuitry which receives the error correction failure signal, and outputs a re-read signal to cause said head to read the digital data from the disk storage medium again.

33. A read channel according to claim 29, wherein said correction device receives the data bytes and the bytes with errors from the headm in a first interleaved order, and outputs the error sequence in a reversed interleaved order which is a reverse of said first interleaved order.

34. A read channel according to claim 33, wherein said second CRC device determines the presence or absence of the error in the error sequence based on a cyclic redundancy check of the first interleaved order and the reversed interleaved order.

35. Read channel apparatus for determining whether digital data read from a digital data storage device is to be error-corrected or re-read, comprising:
- an error correction decoder that receives the digital data read from the storage device, the data comprising data bytes and bytes with errors interleaved in a first order, said decoder outputting an error sequence in a reversed interleaved order;
- a first CRC circuit that receives the digital data read from the storage device in the first interleaved order, and outputs a CRC checksum in an interleaved order that is different from the reversed interleaved order;
- a second CRC circuit that receives both the error sequence and the CRC checksum, performs a mathematical combination operation on the error sequence and the CRC checksum, and outputs an error signal when the combination determines that an error exists in the error sequence;
- error correction circuitry for error-correcting the received data bytes when said second CRC circuit does not output the error signal; and
- control circuitry for causing the digital data to be re-read from the digital data storage device when said-second CRC circuit outputs the error signal.

36. Apparatus according to claim 35, wherein the first and second CRC circuits operate at a bit clock rate, and wherein said second CRC circuit determines that there is no error in the error sequence when a remainder of said mathematical operation is substantially zero.

37. Apparatus according to claim 36, wherein said error correction circuitry comprises:
- a memory for receiving the digital data read from the storage device in the first interleaved order;
- a FIFO circuit coupled to said decoder, for storing the error sequence; and
- a memory manager, coupled to said FIFO and to said memory, for correcting the digital data stored in said memory based on the error sequence stored in said FIFO.

38. Apparatus according to claim 37, wherein said memory manager corrects the stored digital data in response to said second CRC device determining that there is no error in the error sequence.

39. Apparatus according to claim 35, further comprising a reading device which reads the digital data from the storage device.

40. Apparatus according to claim 35, wherein said decoder comprises a Reed-Soloman decoder.

41. A method for detecting errors in data stored in a data storage medium, comprising the steps of:
- receiving the data and errors from the data storage medium, and outputting an error sequence in a first order;
- receiving the data and errors from the data storage medium, and outputting a CRC checksum in a second order; and
- receiving both the error sequence and the CRC checksum, and outputting a signal indicative of the presence or absence of an error in the error sequence.

42. A method according to claim 41, wherein the third receiving step combines a predetermined number of bytes from the first error sequence with a predetermined number of bytes from the CRC checksum, and determines that there is no error in the error sequence when a remainder of the combination is substantially zero.

43. A method according to claim 42, wherein said third receiving step determines that there is an error in the error sequence when said remainder of said combination is not substantially zero, and outputs a correction failure signal in response to the determined error.

44. A method according to claim 43, further comprising a control step for receiving the correction failure signal, and outputting a re-read signal to cause said data to be read again from the data storage medium.

45. A method according to claim 41, wherein the first receiving step receives the data and errors in a first interleaved order, and outputs the error sequence in a reversed interleaved order which is a reverse of said first interleaved order.

46. A method according to claim 45, wherein the third receiving step determines the presence or absence of the error in the error sequence based on a cyclic redundancy check of the first interleaved order and the reversed interleaved order.

47. A method for determining whether digital data read from a digital data storage device contains errors, comprising the steps of:

receiving the digital data read from the storage device, the data comprising data bytes and bytes with errors interleaved in a first order, and outputting an error sequence in a reversed interleaved order;

receiving the digital data read from the storage device in the first interleaved order, and outputting a CRC checksum in an interleaved order that is different from the reversed interleaved order; and receiving both the error sequence and the CRC checksum, performing a mathematical combination operation on the error sequence and the CRC checksums, and outputting an error signal when the combination determines that an error exists in the error sequence.

48. A method according to claim 47, wherein the third receiving step performs the mathematical combination operation on data from the error sequence and data from the second error sequence, and determines that there is no error in the error sequence when a remainder of said mathematical combination operation is substantially zero.

49. A method according to claim 48, further comprising the steps of: storing the digital data read from the storage device in the first interleaved order; storing the error sequence; and correcting the stored digital data based on the stored error sequence.

50. A method according to claim 49, wherein said correcting step corrects the stored digital data in response to the third receiving step device determining that there is no error in the error sequence.

51. A method according to claim 50, further comprising a control step for causing the digital data to be read again from the storage device when the third receiving step outputs the error signal.

52. A method according to claim 47, further comprising a reading step for reading the digital data from the storage device.

53. A method according to claim 47, wherein the first receiving step is performed with a Reed-Soloman decoder.

54. A method for detecting errors in data stored in a data storage medium, comprising the steps of:

receiving data and errors from the data storage medium, and outputting an error sequence in a first order;

receiving the data and errors from the data storage medium, and outputting a second sequence in a second order; and receiving both the error sequence and the second sequence, and outputting a signal indicative of the presence or absence of an error in the error sequence.

55. A method according to claim 54, wherein the third receiving step combines a predetermined number of bytes from the error sequence with a predetermined number of bytes from the second sequence, and determines that there is no error in the error sequence when a remainder of said combination is substantially zero.

56. A method according to claim 55, wherein said third receiving step determines that there is an error in the error sequence when said remainder of said combination is not substantially zero, and outputs a correction failure signal in response to the determined error.

57. A method according to claim 56, further comprising the step of receiving the correction failure signal, and outputting a re-read signal to cause said data to be read again from the data storage medium.

58. A method according to claim 54, wherein the first receiving step receives the data and errors from the storage medium in a first interleaved order, and outputs the error sequence in a reversed interleaved order which is a reverse of said first interleaved order.

59. A method according to claim 58, wherein the third receiving step determines the presence or absence of the error in the error sequence based on a cyclic redundancy check of the first interleaved order and the reversed interleaved order.

60. A method for determining whether digital data read from a digital data storage device contains errors, comprising the steps of:

receiving the digital data read from the storage device, the data comprising data bytes and error bytes interleaved in a first order, the first receiving step outputting an error sequence in a reversed interleaved order;

receiving the digital data read from the storage device in the first interleaved order, the second receiving step outputting a second sequence in an interleaved order that is different from the reversed interleaved order; and receiving both the error sequence and the second sequence, performing a mathematical operation on said sequences, and outputting an error signal when the combination determines that an error exists in the error sequence.

61. A method according to claim 60, wherein the third receiving step performs the mathematical operation on data from the error sequence and data from the second sequence, and determines that there is no error in the error sequence when a remainder of said mathematical operation is substantially zero.

62. A method according to claim 61, further comprising the steps of: storing the digital data read from the storage device in the first interleaved order; storing the error sequence; and correcting the stored digital data based on the stored error sequence.

63. A method according to claim 62, wherein said correcting step corrects the stored digital data in response to the third receiving step determining that there is no error in the error sequence.

64. A method according to claim 62, further comprising the step of causing the digital data to be read again from the storage device when the third receiving step outputs the error signal.

65. A method according to claim 62, further comprising the step of reading the digital data from the storage device.

66. A method according to claim 62, wherein the first receiving step is performed with a Reed-Soloman decoder.

67. A method according to claim 62, wherein the second receiving step is performed with a first CRC circuit, and wherein the third receiving step is performed with a second CRC circuit, the first and second CRC circuits operating at a bit clock rate.

68. A method according to claim 62, wherein the digital data storing step is performed with a buffer memory, wherein the first error sequence storing step is performed with a FIFO, and wherein said correcting step is performed with a buffer manager.

69. A method of operating a read channel to read digital data from a disk storage medium, the read data including data bytes and bytes with errors, the method comprising the steps of:

controlling a head for reading the digital data from the disk storage medium;

an error correction step which receives the data bytes and the bytes with errors, performs an error correction operation on the received bytes, and outputs an error sequence in a first order;

a first CRC step which receives the data bytes and the bytes with errors, performs a cyclic redundancy check operation on the received bytes, and outputs a CRC checksum in a second order; and a second CRC step which receives both the error sequences and the CRC checksum, performs a cyclic redundancy check operation on the received sequences, and outputs a signal indicative of the presence or absence of an error in the error sequence.

70. A method according to claim 69, wherein said second CRC step combines a predetermined number of bytes from the first error sequence with a predetermined number of bytes from the CRC checksum, and determines that there is no error in the error sequence when a remainder of the combination is substantially zero.

71. A method according to claim 70, wherein said second CRC step determines that there is an error in the error sequence when said remainder of said combination is not substantially zero, and outputs an error correction failure signal in response to the determined error.

72. A method according to claim 71, further comprising a control step which receives the error correction failure signal, and outputs a re-read signal to cause the head control step to read the digital data from the disk storage medium again.

73. A method according to claim 69, wherein said error correction step receives the data bytes and the bytes with errors in a first interleaved order, and outputs the error sequence in a reversed interleaved order which is a reverse of said first interleaved order.

74. A method according to claim 73, wherein said second CRC step determines the presence or absence of the error in the error sequence based on a cyclic redundancy check of the first interleaved order and the reversed interleaved order.

75. A method for determining whether digital data read from a digital data storage device is to be error-corrected or re-read, comprising:

an error correction decoding step that receives the digital data read from the storage device, the read data comprising data bytes and bytes with errors, interleaved in a first order, said decoding step outputting an error sequence in a reversed interleaved order;

a first CRC step that receives the digital data read from the storage device in the first interleaved order, and outputs a CRC checksum in an interleaved order that is different from the reversed interleaved order;

a second CRC step that receives both the error sequence and the CRC checksum, performs a mathematical operation on bytes with errors, and outputs an error signal when the combination determines that an error exists in the error sequence;

an error correction step for error-correcting the received data bytes when said second CRC step does not output the error signal; and a control step for causing the digital data to be re-read from the digital data storage device when said second CRC step outputs the error signal.

76. A method according to claim 75, wherein said second CRC step performs the mathematical operation on data from the error sequence and data from the CRC checksum, and determines that there is no error in the error sequence when a remainder of said mathematical operation is substantially zero.

77. A method according to claim 76, wherein said error correction step comprises the steps of:

storing the digital data read from the storage device in the first interleaved order;

storing the error sequence; and correcting the stored digital data based on the stored error sequence.

78. A method according to claim 77, wherein the correcting step corrects the stored digital data in response to said second CRC step determining that there is no error in the error sequence.

79. A method according to claim 75, further comprising a step of reading the digital data from the storage device.

80. A method according to claim 75; wherein said decoder step is performed with a Reed-Soloman decoder.

* * * * *